(12) United States Patent
Ueta (10) Patent No.: US 12,433,067 B2
(45) Date of Patent: Sep. 30, 2025

(54) LIGHT-EMITTING ELEMENT AND LIGHT-EMITTING DEVICE

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 725 days.

(21) Appl. No.: 17/790,921

(22) PCT Filed: Jan. 15, 2020

(86) PCT No.: PCT/JP2020/001122
§ 371 (c)(1),
(2) Date: Jul. 5, 2022

(87) PCT Pub. No.: WO2021/144892
PCT Pub. Date: Jul. 22, 2021

(65) Prior Publication Data
US 2023/0035091 A1    Feb. 2, 2023

(51) Int. Cl.
*H10K 50/155* (2023.01)
*H10H 20/812* (2025.01)
*H10K 50/15* (2023.01)
*H10K 50/115* (2023.01)
*H10K 102/00* (2023.01)

(52) U.S. Cl.
CPC ......... *H10H 20/812* (2025.01); *H10K 50/155* (2023.02); *H10K 50/156* (2023.02); *H10K 50/115* (2023.02); *H10K 2102/00* (2023.02)

(58) Field of Classification Search
CPC ........................... H10K 50/155; H10K 50/156
See application file for complete search history.

(56) References Cited

U.S. PATENT DOCUMENTS

| | | |
|---|---|---|
| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2017/0125635 A1 | 5/2017 | Bawendi et al. |
| 2023/0035091 A1* | 2/2023 | Ueta .................. H10H 20/812 |

FOREIGN PATENT DOCUMENTS

| | | |
|---|---|---|
| JP | 2005-268384 A | 9/2005 |
| JP | 2012023388 A | 2/2012 |

* cited by examiner

*Primary Examiner* — Mark V Prenty
(74) *Attorney, Agent, or Firm* — ScienBiziP, P.C.

(57) ABSTRACT

A light-emitting element according to the present invention includes an anode, a hole transport layer, and a light-emitting layer containing a quantum dot, and a cathode in this order, and the hole transport layer includes an n+-type semiconductor layer, and a p+-type semiconductor layer adjacent to the n+-type semiconductor layer and disposed closer to the light-emitting layer than the n+-type semiconductor layer.

20 Claims, 7 Drawing Sheets

LIGHT-EMITTING ELEMENT AND LIGHT-EMITTING DEVICE

TECHNICAL FIELD

The present disclosure relates to a light-emitting element containing quantum dots in its light-emitting layer, and to a light-emitting device including the light-emitting element.

BACKGROUND ART

Conductive organic substances have extremely lower carrier mobility than conductive inorganic substances, including metals and semiconductors. Further, energization advances an electrochemical reaction at the joint interface between a conductive organic substance and a conductive inorganic substance. It is hence required to use a conductive inorganic substance for a hole transport layer.

Patent Literature 1 discloses a configuration of using a p-type GaN quantum dot for the hole transport layer.

Patent Literature 2 discloses a configuration of using a p-type NiO thin film for the hole transport layer.

CITATION LIST

Patent Literatures

Patent Literature 1: Japanese Unexamined Patent Application Publication No. 2005-268384 (published on Sep. 29, 2005)

Patent Literature 2: Japanese Unexamined Patent Application Publication No. 2012-23388 (published on Feb. 2, 2012)

Summary

Technical Problem

In the configurations disclosed in Patent Literatures 1 and 2 however, ionization potential, that is, the level of the highest occupied molecular orbital (HOMO), is not consistent between an anode and a light-emitting layer. Such level inconsistency has a problem, that is, an inhibition against hole injection into the light-emitting layer.

The present disclosure has been made in view of the problem and aims to achieve a light-emitting element that can improve the efficiency of hole injection into its light-emitting layer, and a light-emitting device including the light-emitting element.

Solution to Problem

To solve the above problem, a light-emitting element according to one aspect of the present disclosure includes the following: an anode; a cathode; a light-emitting layer disposed between the anode and the cathode and containing a quantum dot; and a hole transport layer disposed between the light-emitting layer and the anode, wherein the hole transport layer includes an n+-type semiconductor layer, and a p+-type semiconductor layer adjacent to the n+-type semiconductor layer and disposed closer to the light-emitting layer than the n+-type semiconductor layer.

DISCLOSURE

Advantageous Effect of Disclosure

The foregoing configuration can offer a light-emitting element that can improve the efficiency of hole injection into its light-emitting layer.

BRIEF DESCRIPTION OF DRAWINGS

FIG. 5($a$) is an energy band diagram of each layer in an instance where drive voltage is applied across the light-emitting element according to the first embodiment of the present disclosure, and FIG. 5($b$) is an enlarged energy band diagram of the vicinity of depletion layers.

DESCRIPTION OF EMBODIMENTS

First Embodiment

In the Description, where the group of an element is designated with a Roman number, it is understood that the group is designated based on the nomenclature in the former CAS system. Further, where the group of an element is designated by an Arabic number, it is understood that the group is designated based on the element nomenclature in the current IUPAC system. In the Description, where a numeral range is designated by linking numbers with "to", it is understood that the numeral range is designated by using "equal to or greater than a number" and "less than a number".

Configuration of Light-Emitting Device

Figure 1:
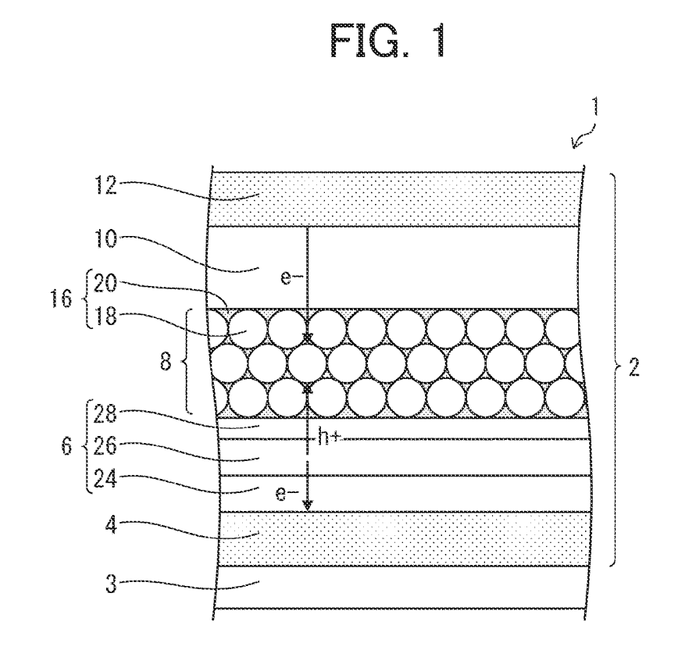
FIG. 1 is a schematic sectional view of a light-emitting device according to a first embodiment of the present disclosure.

FIG. 1 is a schematic sectional view of a light-emitting device 1 according to this embodiment.

As illustrated in FIG. 1, the light-emitting device 1 according to this embodiment includes a light-emitting element 2 and an array substrate 3. The light-emitting device 1 includes a structure with individual layers of the light-emitting element 2 stacked on the array substrate 3, on which thin-film transistors (TFTs) not shown are formed. It is noted that the Description describes a direction of the light-emitting device 1 from the light-emitting element 2 to the array substrate 3 as a downward direction, and a direction of the light-emitting device 1 from the array substrate 3 to the light-emitting element 2 as an upward direction.

The light-emitting element 2 includes a hole transport layer 6, a light-emitting layer 8, an electron transport layer 10, and a cathode 12 in this order from the bottom on an anode 4. The anode 4 of the light-emitting element 2, formed over the array substrate 3, is electrically connected to the TFTs of the array substrate 3. A light-emitting element according to another embodiment may be a light-emitting element including a cathode over an array substrate and including an electron transport layer, a light-emitting layer, a hole transport layer, and an anode in this order on the cathode.

The anode 4 and the cathode 12 contain a conductive material and are electrically connected to the hole transport layer 6 and the electron transport layer 10, respectively.

One of the anode 4 and the cathode 12 is a transparent electrode. The transparent electrode is made of, for instance, ITO, IZO, ZnO, AZO, BZO or other materials and may be formed through sputtering. Further, either the anode 4 or the cathode 12 may contain a metal material, and the metal material is preferably Al, Cu, Au, Ag, or other metals, which have high reflectivity of visible light.

The light-emitting layer 8 is a layer containing a plurality of quantum dots (semiconductor nanoparticles) 16. The light-emitting layer 8 may be a stack of several light-emitting layers. Here, the quantum dots 16 in the light-emitting layer 8 do not need to be disposed regularly, as illustrated in FIG. 1; the quantum dots 16 may be contained in the light-emitting layer 8 disorderly. The light-emitting layer 8 can be formed through spin coating, ink-jet method, or other methods from a dispersion solution with the quantum dots 16 dispersed in a solvent of hexane, toluene, or other things. The dispersion solution may contain a dispersing material, such as a thiol or an amine. The light-emitting layer 8 is preferably 5 to 50 nm thick.

The quantum dots 16 are light-emitting materials that have a valence band level and a conduction band level, and that emits light in response to rejoining of holes at the valence band level and electrons at the conduction band level. Light emitted from the quantum dots 16 has a narrow spectrum due to a quantum confinement effect, and hence, light emission of relatively deep chromaticity can be achieved.

In this embodiment, the quantum dots 16 include a core-shell structure having a core 18 and a shell 20, which is the outer envelope of the core 18. The core 18 is a semiconductor material particle with its band gap included within the range of the band gap of the shell 20. The core 18 may contain a II-IV group semiconductor material or a III-VI group semiconductor material. The core 20 contains a II-IV group semiconductor material.

The quantum dots 16 may have a core of CdSe and a shell of ZnS for instance. Other than this, the quantum dots 16 may be selected, as appropriate, from materials that are used in the field; for instance, the quantum dots 16 may have, for instance, CdSe—CdS, InP—ZnS, ZnSe—ZnS, CIGS-ZnS, or other materials as their core-shell structure.

The quantum dots 16 have a particle diameter of about 3 to 15 nm. The wavelength of light emitted from the quantum dots 16 can be controlled by the particle diameter of the cores 18. Hence, controlling the particle diameter of the cores 18 can control the wavelength of light emitted by the light-emitting device 1. It is noted that the light-emitting layer 8 may further include ligands coordinating with the shells 20 of the quantum dots 16.

The electron transport layer 10 is a layer that transports electrons coming from the cathode 12 to the light-emitting layer 8. The electron transport layer 10 may have the function of inhibiting hole transport. The electron transport layer 10 may contain, for instance, $ZnO$, $TiO_2$, $Ta_2O_3$, $SrTO_3$, or other materials and may be formed through sputtering. The electron transport layer 10 can have a known thickness and preferably has a thickness of 10 to 100 nm.

The hole transport layer 6 is a layer that transports holes coming from the anode 4 to the light-emitting layer 8. In this embodiment, the hole transport layer 6 includes an n+-type semiconductor layer 24, a p+-type semiconductor layer 26, and a p-type semiconductor layer 28 in this order from the bottom. A light-emitting element according to another embodiment may be a light-emitting element including a cathode over an array substrate, and in which a hole transport layer on a light-emitting layer includes a p-type semiconductor layer, a p+-type semiconductor layer, and an n+-type semiconductor layer in this order from the bottom. The n+-type semiconductor layer 24 and the p+-type semiconductor layer 26 are joined to each other, and the p+-type semiconductor layer 26 and the p-type semiconductor layer 28 are joined to each other.

In the Description, a "p-type" semiconductor refers to a positive semiconductor having electrical conductivity of lower order than metals. A "p+-type" semiconductor refers to a positive semiconductor having electrical conductivity of the same order as metals. Likewise, an "n-type" semiconductor refers to a negative semiconductor having electrical conductivity of lower order than metals, and an "n+-type" semiconductor refers to a negative semiconductor having electrical conductivity of the same order as metals. Further, an "i-type" semiconductor refers to an intrinsic semiconductor.

The n+-type semiconductor layer 24 contains a first II-VI group semiconductor as a base material. The first II-VI group semiconductor can contain at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS, and CdTeSe.

The n+-type semiconductor layer 24 further contains a first dopant selected from a group 13 element and a group 17 element, and the conductivity type and carrier concentration of the n+-type semiconductor layer 24 may be controlled by this. The first dopant can contain at least one or more selected from a group 13 element, including Al, In, and Ga, and a group 15 element, including Cl, Br, and I. The addition amount of the first dopant is preferably $1.00E+17$ $[cm^{-3}]$ to $1.00E+23$ $[cm^{-3}]$ and is more desirably $1.00E+18$ $[cm^{-3}]$ to $1.00E+19$ $[cm^{-3}]$.

Alternatively, the first II-VI group semiconductor in the n+-type semiconductor layer 24 has an excess of group II elements with respect to a stoichiometry (stoichiometric composition) state, and the conductivity type and carrier concentration of the n+-type semiconductor layer 24 may be controlled by this. For example, the first II-VI group semiconductor contains Cd and a group VI element, and the content ratio of Cd is larger with respect to the group VI element than that in a stoichiometry state. Such a first II-VI group semiconductor can contain at least one or more selected from the group consisting of CdS, CdSe, CdTe, ZnCdSe, ZnCdS, ZnCdTe, CdSeS, CdTeS, and CdTeSe. The difference between the concentration of the group II element and the concentration of the group VI element is preferably 1.00E+17 [cm$^{-3}$] to 1.00E+23 [cm$^{-3}$] and is more desirably 1.00E+18 [cm$^{-3}$] to 1.00E+19 [cm$^{-3}$].

Alternatively, the n+-type semiconductor layer 24 contains the first dopant, and the first II-VI group semiconductor of the n+-type semiconductor layer 24 has an excess of group II elements, and the conductivity type and carrier concentration of the n+-type semiconductor layer 24 may be controlled by these.

The thickness of the n+-type semiconductor layer 24 has such a degree that a tunnel effect does not occur, and that a quantum well can be achieved. The thickness of the n+-type semiconductor layer 24 is preferably 5 to 50 nm and is more desirably 5 to 10 nm.

The n+-type semiconductor layer 24 is formed by, for instance, forming a film through sputtering using a material doped with n-type impurities in advance as a target onto the anode 4 or the p+-type semiconductor layer 26. Further, the n+-type semiconductor layer 24 may be formed by, for instance, applying an n-type semiconductor material turned into nanoparticles. It is noted that the n+-type semiconductor layer 24 may be formed by performing the foregoing sputtering during n-type impurity doping. Other than these, the n+-type semiconductor layer 24 may be formed through any method.

The p+-type semiconductor layer 26 contains a second II-VI group semiconductor as a base material. The second II-VI group semiconductor can contain at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS, and CdTeSe. The second II-VI group semiconductor of the p+-type semiconductor layer 26 is preferably a semiconductor composed of the same element combination as the first II-VI group semiconductor of the n+-type semiconductor layer 24. For instance, when the first II-VI group semiconductor of the n+-type semiconductor layer 24 is ZnS, the second II-VI group semiconductor of the p+-type semiconductor layer 26 is also ZnS. Further, when the first II-VI group semiconductor of the n+-type semiconductor layer 24 is ZnCdS, the second II-VI group semiconductor of the p+-type semiconductor layer 26 is also ZnCdS.

The p+-type semiconductor layer 26 further contains a second dopant selected from a group 1 element, a group 11 element, and a group 15 element, and the conductivity type and carrier concentration of the p+-type semiconductor layer 26 may be controlled by this. The second dopant can contain one or more selected from a group 15 element, including N and P, a transition metal with an electron layout of 4$s$1, including Cu and Ag, and an alkali metal, including Li and Na. The addition amount of the second dopant is preferably 1.00E+17 [cm$^{-3}$] to 1.00E+23 [cm$^{-3}$] and is more desirably 1.00E+18 [cm$^{-3}$] to 1.00E+19 [cm$^{-3}$]. The addition amount of the second dopant is preferably as large as the addition amount of the first dopant.

The thickness of the p+-type semiconductor layer 26 has such a degree that a tunnel effect does not occur, and the thickness is preferably 5 to 50 nm and is more desirably 4.5 to 10 nm. Additionally, the p+-type semiconductor layer 26 is preferably as thick as the n+-type semiconductor layer 24. To be specific, 80 to 125% of the thickness of the n+-type semiconductor layer 24 is preferable, and 90 to 100% is more desirable.

The p+-type semiconductor layer 26 is formed by, for instance, forming a film through sputtering using a material doped with p-type impurities in advance as a target onto the n+-type semiconductor layer 24 or the p-type semiconductor layer 28. Further, the p+-type semiconductor layer 26 may be formed by, for instance, applying a p-type semiconductor material turned into nanoparticles. It is noted that the p+-type semiconductor layer 26 may be formed by performing the foregoing sputtering during p-type impurity doping. Other than these, the p+-type semiconductor layer 26 may be formed through any method. Further, in a light-emitting element according to another embodiment, the p-type semiconductor layer 28 may be omitted, and the p+-type semiconductor layer 26 may be formed through film formation onto the n+-type semiconductor layer 24 or the light-emitting layer 8.

A thin insulating layer, such as a passivation film, through which electrons or holes can tunnel may be formed between the p+-type semiconductor layer 26 and the n+-type semiconductor layer 24. Further, in a light-emitting element according to another embodiment, a thin insulating layer, such as a passivation film, through which electrons or holes can tunnel may be formed between the p+-type semiconductor layer 26 and the p-type semiconductor layer 28 or the light-emitting layer 8. In the Description, "adjacent" includes both a direct-joining configuration, and a joining configuration with a thin layer that can be tunneled being interposed.

The p-type semiconductor layer 28 contains a third II-VI group semiconductor as a base material. The third II-VI group semiconductor can contain at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS, and CdTeSe. The third II-VI group semiconductor of the p-type semiconductor layer 28 is preferably a semiconductor composed of the same element combination as the second II-VI group semiconductor of the p+-type semiconductor layer 26.

The p-type semiconductor layer 28 further contains a third dopant selected from a group 1 element, a group 11 element, and a group 15 element, and the conductivity type and carrier concentration of the p-type semiconductor layer 28 may be controlled by this. The third dopant can contain one or more selected from a group 15 element, including N and P, a transition metal with an electron layout of 4$s$1, including Cu and Ag, and an alkali metal, including Li and Na. The third dopant preferably contains the same element as the second dopant. The concentration of the third dopant in the p-type semiconductor layer 28 with respect to the third II-VI group semiconductor is lower than the concentration of the second dopant in the p+-type semiconductor layer 26 with respect to the second II-VI group semiconductor. As a result, the carrier concentration of the p-type semiconductor layer 28 is lower than the carrier concentration of the p+-type semiconductor layer 26. The addition amount of the third dopant is preferably 1.00E+18 [cm$^{-3}$] to 1.00E+20 [cm$^{-3}$] and is more desirably 1.00E+18 [cm$^{-3}$] to 1.00E+19 [cm$^{-3}$].

The thickness of the p-type semiconductor layer 28 is preferably smaller than the thicknesses of the n+-type semiconductor layer 24 and p+-type semiconductor layer 26 and preferably has such a degree that a tunnel effect does not occur. To be specific, 5 to 20 nm is preferable, and 5 to 8 nm is more desirable. It is noted that the thickness of the entire hole transport layer 6 is preferably 100 nm or smaller and is more desirably 75 nm or smaller in order to prevent increase in electrical resistance.

The p-type semiconductor layer 28 can be also formed through various methods, like the p+-type semiconductor layer 26. The method of forming the p-type semiconductor layer 28 may be the same as or different from the method of forming the p+-type semiconductor layer 26.

Here, let the II-IV group semiconductor material contained in the shells 20 be defined as a fourth II-IV group semiconductor. In this case, the first to third II-IV group semiconductors may be composed of the same element composition as the fourth II-IV group semiconductor or may have a group II element belonging to a lower period in the periodic table than the group II element contained in the fourth II-IV group semiconductor. The second II-VI group semiconductor of the p+-type semiconductor layer 26 is preferably composed of the same element combination as the fourth II-IV group semiconductor. In contrast, the first II-IV group semiconductor of the n+-type semiconductor layer 24 preferably has a group II element belonging to a lower period in the periodic table than the group II element contained in the fourth II-IV group semiconductor. For instance, the n+-type semiconductor layer 24 preferably contains Cd, which is lower than Zn, when the shells 20 contain Zn.

As earlier described, (i) the second II-VI group semiconductor of the p+-type semiconductor layer 26 is preferably composed of the same element combination as the first II-VI group semiconductor of the n+-type semiconductor layer 24, and (ii) the third II-VI group semiconductor of the p-type semiconductor layer 28 is preferably composed of the same element combination as the second II-VI group semiconductor of the p+-type semiconductor layer 26. Accordingly, the first to fourth II-IV group semiconductors are preferably any of the following three combinations. In the first combination, the first to third II-IV group semiconductors are composed of the same element combination as the fourth II-VI group semiconductor. In the second combination, the first to third II-IV group semiconductors are composed of element combinations identical to each other and have a group II element belonging to a lower period in the periodic table than the group II element contained in the fourth II-IV group semiconductor. In the third combination, the first II-IV group semiconductor has a group II element belonging to a lower period in the periodic table than the group II element contained in the fourth II-IV group semiconductor, and the second to third II-IV group semiconductors are composed of the same element combination as the fourth II-VI group semiconductor.

Energy Band of Light-Emitting Element

Figure 2:
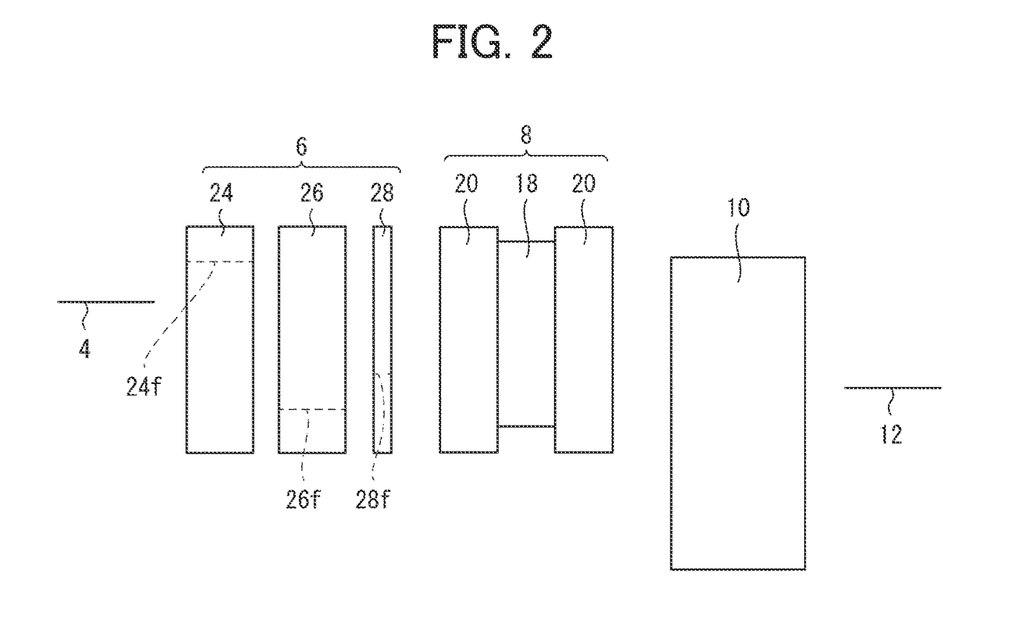
FIG. 2 is an energy band diagram illustrating an example Fermi level or an example band gap in an instance where individual layers of a light-emitting element according to the first embodiment of the present disclosure are not stacked.

The following describes the energy band in each layer of the light-emitting element 2 according to this embodiment with reference to FIG. 2.

FIG. 2 is an energy band diagram illustrating an example Fermi level or an example band gap in an instance where the individual layers of the light-emitting element 2 according to this embodiment are not stacked.

It is noted that the energy band diagram in the Description illustrates the energy level of each layer with reference to a vacuum level. It is also noted that the energy band diagram in the Description illustrates the Fermi level or band gap of a component corresponding to a provided component number. With regard to the anode 4 and the cathode 12, their Fermi levels are illustrated individually, and with regard to the hole transport layer 6, the light-emitting layer 8, and the electron transport layer 10, their band gaps from the electron affinities to the ionization potentials are illustrated individually. Here, with regard to the hole transport layer 6, the respective band gaps of the n+-type semiconductor layer 24, the p+-type semiconductor layer 26, and the p-type semiconductor layer 28 are illustrated separately, and their respective Fermi levels 24f, 26f, and 28f are illustrated separately. Further, with regard to the light-emitting layer 8, the respective band gaps of the core 18 and shell 20 are illustrated separately.

In this embodiment, for instance, each of the layers 24, 26, and 28 of the hole transport layer 6 has an ionization potential of 5.2 eV and an electron affinity of 3.2 eV when the n+-type semiconductor layer 24, p+-type semiconductor layer 26, and p-type semiconductor layer 28 of the hole transport layer 6 all contain ZnS as their base materials. Further, in this embodiment, for instance, the electron transport layer 10 has an ionization potential of 7.0 eV and an electron affinity of 3.8 eV when the electron transport layer 10 contains ZnO. Further, in this embodiment, for instance, the shells 20 have an ionization potential of 5.2 eV and an electron affinity of 3.2 eV when the shells 20 contain ZnS.

Here, example material combinations in each layer in this embodiment will be shown in Example 1 to Example 10 in Table 1. It is noted that the columns "Ionization potential" and "Electron affinity" in Table 1 show individual levels in the unit eV with reference to a vacuum level. It is also noted that Table 1 provides numeric values in a state where the individual layers are not stacked.

| | Hole transport layer | | | | | | | | | Quantum dot | |
|---|---|---|---|---|---|---|---|---|---|---|---|
| | Base material | | | Dopant | | | | | | Shell | |
| | | | n+-type semiconductor layer | | p+-type semiconductor layer | | p-type semiconductor layer | | | | |
| | Material | Ionization potential (eV) | Electron affinity (eV) | Material | Concentration ($cm^{-3}$) | Material | Concentration ($cm^{-3}$) | Material | Concentration ($cm^{-3}$) | Material | Ionization potential (eV) | Electron affinity (eV) |
| Example 1 | ZnS | 5.2 | 3.2 | Al | 1.00E+18 | N | 1.00E+18 | N | 1.00E+16 | ZnS | 5.2 | 3.2 |
| Example 2 | ZnSe | 5.5 | 2.7 | Al | 1.00E+20 | N | 1.00E+20 | N | 1.00E+16 | ZnSe | 5.5 | 2.7 |
| Example 3 | CdS | 6.2 | 3.7 | Al | 1.00E+22 | N | 1.00E+22 | N | 1.00E+16 | CdS | 6.2 | 3.7 |
| Example 4 | ZnS | 5.2 | 3.2 | In | 1.00E+18 | Cu | 1.00E+18 | Cu | 1.00E+16 | ZnS | 5.2 | 3.2 |
| Example 5 | ZnSe | 5.5 | 2.7 | In | 1.00E+20 | Cu | 1.00E+20 | Cu | 1.00E+16 | ZnSe | 5.5 | 2.7 |
| Example 6 | CdS | 6.2 | 3.7 | In | 1.00E+22 | Cu | 1.00E+22 | Cu | 1.00E+16 | CdS | 6.2 | 3.7 |
| Example 7 | ZnS | 5.2 | 3.2 | Ga | 1.00E+18 | Li | 1.00E+18 | Li | 1.00E+16 | ZnS | 5.2 | 3.2 |
| Example 8 | ZnSe | 5.5 | 2.7 | Ga | 1.00E+20 | Li | 1.00E+20 | Li | 1.00E+16 | ZnSe | 5.5 | 2.7 |

-continued

| | Hole transport layer | | | | | | | | | | Quantum dot | |
|---|---|---|---|---|---|---|---|---|---|---|---|---|
| | Base material | | | Dopant | | | | | | | Shell | |
| | | | | n+-type semiconductor layer | | p+-type semiconductor layer | | p-type semiconductor layer | | | | |
| | Material | Ionization potential (eV) | Electron affinity (eV) | Material | Concentration ($cm^{-3}$) | Material | Concentration ($cm^{-3}$) | Material | Concentration ($cm^{-3}$) | Material | Ionization potential (eV) | Electron affinity (eV) |
| Example 9 | CdS | 6.2 | 3.7 | Ga | 1.00E+22 | Li | 1.00E+22 | Li | 1.00E+16 | CdS | 6.2 | 3.7 |
| Example 10 | ZnS | 5.2 | 3.2 | B | 1.00E+18 | N | 1.00E+18 | N | 1.00E+16 | ZnS | 5.2 | 3.2 |

In Table 1, the columns "Material", "Ionization potential", and "Electron affinity" in the column "Hole transport layer", "Base material" respectively show materials contained in the n+-type semiconductor layer 24, p+-type semiconductor layer 26, and p-type semiconductor layer 28 of the hole transport layer 6 in each example as their base materials, the ionization potentials, and electron affinities of these materials in each example. The columns "Material" and "Concentration" in the column "Hole transport layer", "Dopant", "n+-type semiconductor layer" respectively show the material of the first dopant in the n+-type semiconductor layer 24 in each example, and the concentration of the first dopant doped into the base material of the n+-type semiconductor layer 24 in each example. Likewise, the columns "Material" and "Concentration" in the column "Hole transport layer", "Dopant", "p+-type semiconductor layer" respectively show the material of the second dopant of the p+-type semiconductor layer 26 in each example, and the concentration of the second dopant doped into the base material of the p+-type semiconductor layer 26 in each example. Likewise, the columns "Material" and "Concentration" in the column "Hole transport layer", "Dopant", "p-type semiconductor layer" respectively show the material of the third dopant of the p-type semiconductor layer 28 in each example, and the concentration of the third dopant doped into the base material of the p-type semiconductor layer 28 in each example. The columns "Material", "Ionization potential", and "Electron affinity" in the column "Quantum dot", "Shell" respectively show the material of the shells 20, covering the cores 18 of the quantum dots 16, in each example, and the ionization potential and electron affinity of the material in each example.

It is noted that although the materials contained in the n+-type semiconductor layer 24, the p+-type semiconductor layer 26, and the p-type semiconductor layer 28 as their base materials are the same as the material of the shells 20 in Examples 1 to 10 shown in Table 1, the scope of the present disclosure is not limited to this. The materials contained in the n+-type semiconductor layer 24, the p+-type semiconductor layer 26, and the p-type semiconductor layer 28 as their base materials may be different from the material of the shells 20 or may be different from each other.

Figure 3:
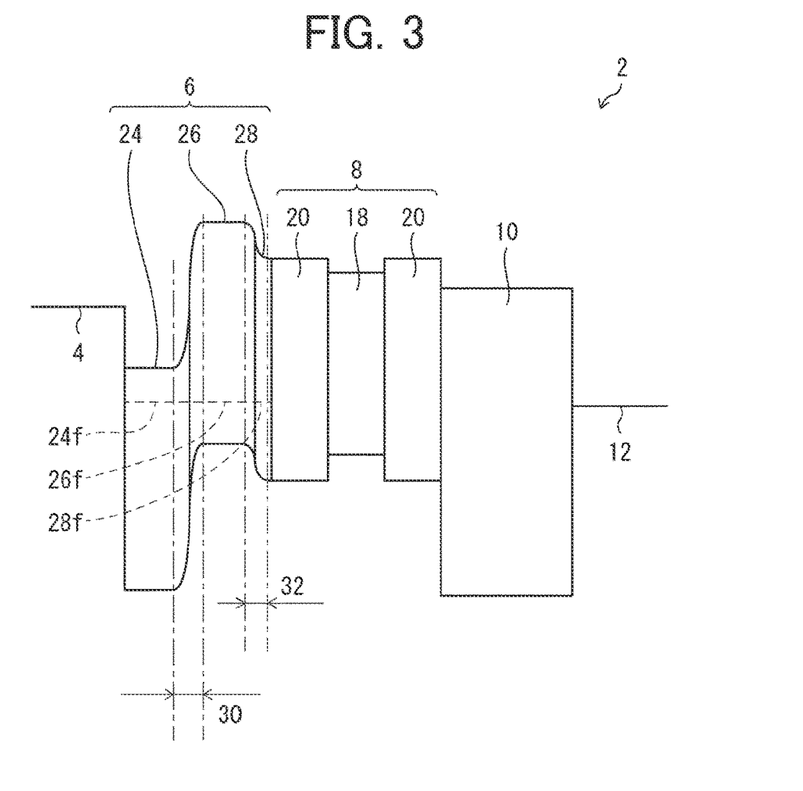
FIG. 3 is an energy band diagram illustrating an example Fermi level or an example band gap in an instance where the individual layers of the light-emitting element according to the first embodiment of the present disclosure are stacked.

FIG. 3 is an energy band diagram illustrating an example Fermi level or an example band gap in an instance where the individual layers of the light-emitting element 2 according to this embodiment are stacked.

In this embodiment, in the light-emitting element 2 with the individual layers stacked, the Fermi levels or band gaps of the anode 4, light-emitting layer 8, electron transport layer 10, and cathode 12 little change from their respective levels or band gaps in an individual state. However, in the hole transport layer 6 of the light-emitting element 2 with the individual layers stacked, the Fermi level and the band gap are changed by adjacency. In the hole transport layer 6, the n+-type semiconductor layer 24 and the p+-type semiconductor layer 26 are pn-joined to be adjacent to each other, and the p+-type semiconductor layer 26 and the p-type semiconductor layer 28 are adjacent to each other. This adjacency changes the electron affinity and ionization potential of each of the n+-type semiconductor layer 24, p+-type semiconductor layer 26, and p-type semiconductor layer 28, as illustrated in FIG. 3. At the same time, a depletion layer 30 is produced astride the n+-type semiconductor layer 24 and the p+-type semiconductor layer 26, and a depletion layer 32 is produced astride the p+-type semiconductor layer 26 and the p-type semiconductor layer 28.

To be specific, the foregoing adjacency causes a large quantity of electrons to diffuse from the n+-type semiconductor layer 24 to the p+-type semiconductor layer 26 and causes a large quantity of holes to diffuse from the p+-type semiconductor layer 26 to the n+-type semiconductor layer 24. The adjacency also causes electrons to diffuse from the p-type semiconductor layer 28 to the p+-type semiconductor layer 26 and causes holes to diffuse from the p+-type semiconductor layer 26 to the p-type semiconductor layer 28. The foregoing diffusion continues until the Fermi levels 24f, 26f, and 28f of the n+-type semiconductor layer 24, p+-type semiconductor layer 26, and p-type semiconductor layer 28 reach a state of thermal equilibrium, which is a state where the Fermi levels 24f, 26f, and 28f coincide with each other.

Both the carrier density of the n+-type semiconductor layer 24 alone and the carrier density of the p+-type semiconductor layer 26 alone are very large. Hence, the adjacency between the n+-type semiconductor layer 24 and the p+-type semiconductor layer 26 greatly changes both of the respective electron affinities and ionization potentials of the n+-type semiconductor layer 24 and p+-type semiconductor layer 26.

To be specific, the electron affinity and ionization potential of the n+-type semiconductor layer 24 change greatly from the interface between the n+-type semiconductor layer 24 and the p+-type semiconductor layer 26 toward the interface between the n+-type semiconductor layer 24 and the anode 4. Likewise, the electron affinity and ionization potential of the p+-type semiconductor layer 26 change greatly from the interface between the n+-type semiconductor layer 24 and the p+-type semiconductor layer 26 toward the interface between the p+-type semiconductor layer 26 and the p-type semiconductor layer 28.

The carrier density of the p-type semiconductor layer 28 alone is very smaller than the carrier density of the p+-type semiconductor layer 26 alone. Hence, the adjacency between the p+-type semiconductor layer 26 and the p-type semiconductor layer 28 changes the respective electron affinities and ionization potentials of the p+-type semiconductor layer 26 and the p-type semiconductor layer 28 and changes the electron affinity and ionization potential of the p+-type semiconductor layer 26 to be larger than those of the p-type semiconductor layer 28.

To be specific, the electron affinity and ionization potential of the p+-type semiconductor layer 26 change greatly from the interface between the p+-type semiconductor layer 26 and the p-type semiconductor layer 28 toward the interface between the n+-type semiconductor layer 24 and the p+-type semiconductor layer 26. In contrast, the electron affinity and ionization potential of the p-type semiconductor layer 28 change a little only near the interface between the p+-type semiconductor layer 26 and the p-type semiconductor layer 28.

Table 2 shows the amount of level change resulting from the foregoing diffusion, in the Fermi levels 24f and 26f of the n+-type semiconductor layer 24 and p+semiconductor layer 26 in the light-emitting element 2 according to this embodiment and shows their ionization potentials and electron affinities in a state of thermal equilibrium. It is noted that Table 2 provides numeric values in the unit eV and examples, which correspond to the respective examples in Table 1.

TABLE 2

| | Hole transport layer | | | | | |
| | n+-type semiconductor layer | | | p+-type semiconductor layer | | |
| | Level change amount (eV) | Ionization potential (eV) | Electron affinity (eV) | Level change amount (eV) | Ionization potential (eV) | Electron affinity (eV) |
|---|---|---|---|---|---|---|
| Example 1 | 0.6 | 5.8 | 3.8 | 0.4 | 4.8 | 2.8 |
| Example 2 | 0.94 | 6.44 | 3.64 | 0.63 | 4.87 | 2.07 |
| Example 3 | 1.3 | 7.5 | 5.0 | 0.87 | 5.33 | 2.83 |
| Example 4 | 0.6 | 5.8 | 3.8 | 0.4 | 4.8 | 2.8 |
| Example 5 | 0.94 | 6.44 | 3.64 | 0.63 | 4.87 | 2.07 |
| Example 6 | 1.3 | 7.5 | 5.0 | 0.87 | 5.33 | 2.83 |
| Example 7 | 0.6 | 5.8 | 3.8 | 0.4 | 4.8 | 2.8 |
| Example 8 | 0.94 | 6.44 | 3.64 | 0.63 | 4.87 | 2.07 |
| Example 9 | 1.3 | 7.5 | 5.0 | 0.87 | 5.33 | 2.83 |
| Example 10 | 0.6 | 5.8 | 3.8 | 0.4 | 4.8 | 2.8 |

As shown in Table 2, the ionization potential and electron affinity of the n+-type semiconductor layer 24 in post-stacking are larger than the ionization potential and electron affinity of the p+-type semiconductor layer 26 in any of the examples when compared to those in pre-stacking.

Effect of Light-Emitting Element

An effect of the light-emitting element 2 according to this embodiment will be described in comparison between an energy band diagram of a light-emitting element 102 according to a comparative embodiment illustrated in FIG. 4 and energy band diagrams of the light-emitting element 2 according to this embodiment illustrated in FIG. 3 and FIG. 5.

Figure 4:
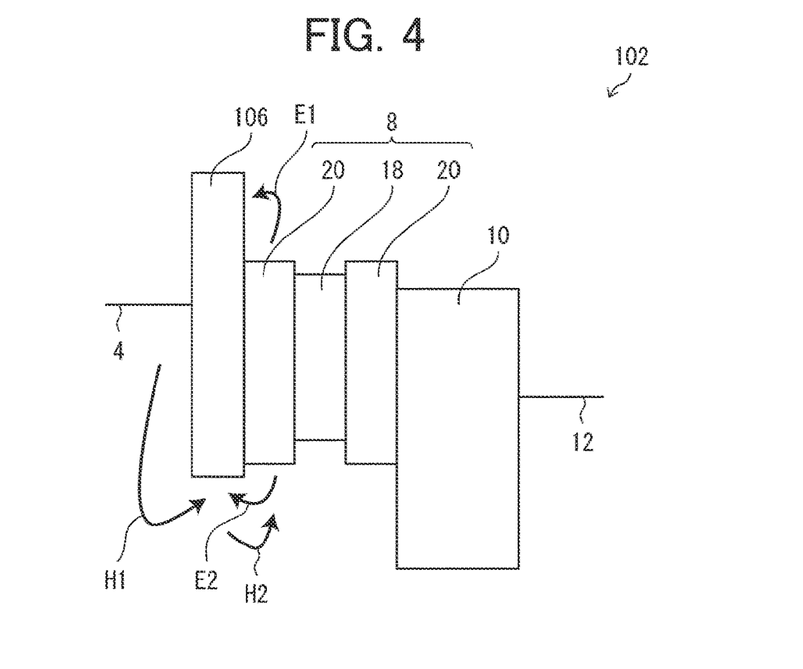
FIG. 4 is an energy band diagram of a light-emitting element according to a comparative embodiment.

The light-emitting element 102 according to the comparative example illustrated in FIG. 4 is different in configuration from the light-emitting element 2 according to this embodiment illustrated in FIG. 3 only in that a hole transport layer 106 according to the comparative embodiment is included instead of the hole transport layer 6 according to this embodiment. The hole transport layer 106 according to the comparative embodiment is a p-type semiconductor monolayer containing a metal oxide semiconductor (NiO in a stoichiometry state) and has an ionization potential of 5.6 eV and an electron affinity of 2.1 eV. Thus, the levels of the individual layers of the light-emitting element 102 according to the comparative embodiment are regarded to be, except for the hole transport layer 106, the same as the level of the light-emitting element 2 alone according to this embodiment before stacking of the individual layers.

Upon a potential difference occurring between the anode 4 and cathode 12 of the light-emitting element according to the comparative embodiment, holes are injected from the anode 4 into the hole transport layer 106, and electrons are injected from the cathode 12 into the electron transport layer 10. Thereafter, the holes injected into the hole transport layer 106 and the electrons injected into the electron transport layer 10 reach the cores 18 via the shells 20 of the quantum dots 16 of the light-emitting layer 8. The holes and electrons rejoin together in the cores 18, thus generating excitons.

Here, electrons that are to be further transported to the hole transport layer 106 via the shells 20 are blocked, as denoted by Arrow E1 in FIG. 4, when the electron affinity of the hole transport layer 106 is larger than the electron affinity of the shells 20. This increases the concentration of electrons that remain in the light-emitting layer 8, thus improving light emission efficiency.

However, the difference between the Fermi level of the anode 4 and the ionization potential of the hole transport layer 106 is relatively large in the comparative embodiment. Hence, a barrier, denoted by Arrow H1 in FIG. 4, to hole injection from the anode 4 into the hole transport layer 106 is relatively large.

Furthermore, the ionization potential of the hole transport layer 106 is larger than the ionization potential of the shells 20 in the comparative embodiment. Hence, the hole concentration in the hole transport layer 106 is relatively low. Hence, the efficiency of hole injection from the hole transport layer 106 into the shell 20, denoted by Arrow H2 in FIG. 4, does not improve in the light-emitting element according to the comparative embodiment.

Accordingly, in the light-emitting element 102 according to the comparative embodiment, the efficiency of hole injection into the light-emitting layer 8 lowers due to the foregoing barrier to hole injection. Hence, the carrier balance in the light-emitting layer 8 deteriorates, and the course of non-light-emission in the light-emitting layer 8 increases, thus deteriorating the external quantum efficiency of the entire light-emitting element 102.

To improve the hole injection efficiency alone, a material with a smaller band gap needs to be used for the material of the hole transport layer 106. However, reducing the band gap of the hole transport layer 106 simply alone, which prevents the hole transport layer 106 from easily blocking electron transport from the light-emitting layer 8 to the anode 4, does not lead to an improvement in the external quantum efficiency of the light-emitting element 102 in some cases.

Furthermore, reducing the band gap of the hole transport layer 106 simply alone can expect only a limited improvement in hole injection efficiency. This is because that room for improvements in the efficiency of hole transport from the anode 4 to the light-emitting layer 8 is limited by the difference in ionization energy between the anode 4 and the light-emitting layer 8. The larger the difference in ionization potential between the layers including the anode 4 through the light-emitting layer 8 is, and the larger the sum total of the difference is, the lower the efficiency of hole transport from the anode 4 to the light-emitting layer 8 is. The anode 4 and the light-emitting layer 8 have ionization energy levels that are considerably different from each other.

In the light-emitting element 2 according to this embodiment, hole transport from the anode 4 to the light-emitting layer 8 is not performed. Instead, in the light-emitting element 2 according to this embodiment, electron transport from the p+-type semiconductor layer 26 of the hole transport layer 6 to the anode 4, and hole transport from the p+-type semiconductor layer 26 of the hole transport layer 6 to the light-emitting layer 8 are performed in combination, as illustrated in FIG. 2. The following details this.

Figure 5:
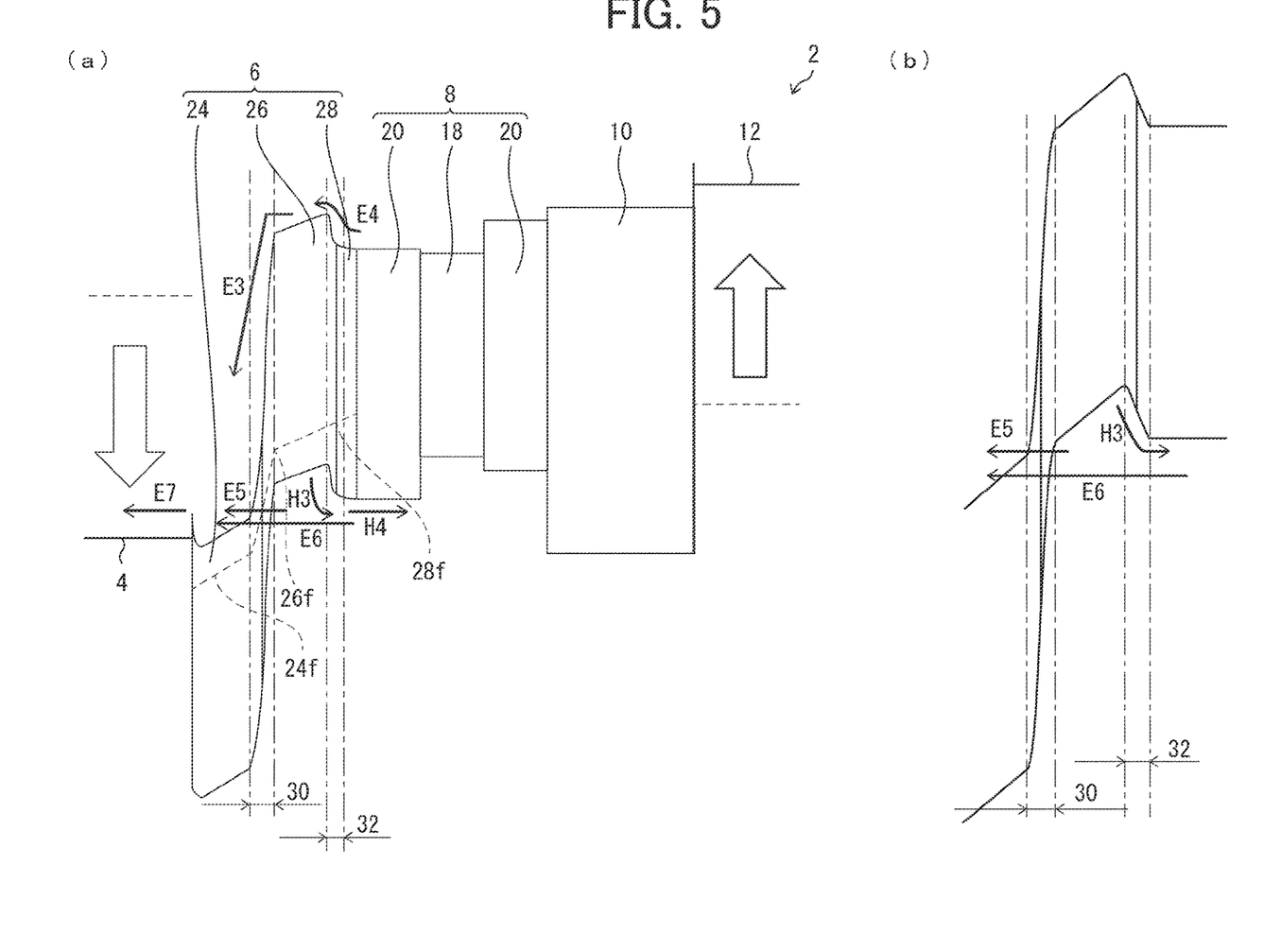

FIG. 5(a), which is on the left side of FIG. 5, is an energy band diagram of each layer in an instance where drive voltage is applied across the light-emitting element 2 according to this embodiment, and FIG. 5(b), which is on the right side of FIG. 5, is an enlarged energy band diagram of the vicinity of the depletion layer 30 and depletion layer 32. In the light-emitting element 2 according to this embodiment as well, holes and electrons are transported, thus generating excitons in the light-emitting layer 8, like the light-emitting element 102 according to the comparative embodiment. However, hole injection from the hole transport layer 6 into the shells 20 is caused by a resonance tunnel effect that occurs in the hole transport layer 6. The drive voltage of the light-emitting element 2 applies positive voltage to the anode 4 and applies negative voltage to the cathode 12. Such drive voltage is a reverse bias with respect to the adjacency between the n+-type semiconductor layer 24 and the p+-type semiconductor layer 26 and is a forward bias with respect to the adjacency between the p+-type semiconductor layer 26 and the p-type semiconductor layer 28.

In this embodiment, the pn-joining between the n+-type semiconductor layer 24 and the p+-type semiconductor layer 26 reduces the electron affinity of the n+-type semiconductor layer 24 and increases the electron affinity of the p+-type semiconductor layer 26, as illustrated in FIG. 3. During drive voltage application, the electron affinity of the n+-type semiconductor layer 24 reduces further, producing a considerably large difference between the electron affinity of the n+-type semiconductor layer 24 and the electron affinity of the p+-type semiconductor layer 26, as illustrated in FIG. 5(a). Hence, the efficiency of electron transport from the p+-type semiconductor layer 26 to the n+-type semiconductor layer 24, denoted by Arrow E3 in FIG. 5(a), is reduced by the level inconsistency between the electron affinities. In addition, since the carriers of the p+-type semiconductor layer 26 and p-type semiconductor layer 28 are positive holes, electron transport from the shell 20 denoted by Arrow E4 in FIG. 5(a) through the p-type semiconductor layer 28 and p+-type semiconductor layer 26 has to exceed the barrier at the interface and is hence difficult. Thus, the hole transport layer 6 has the function of blocking electron transport from the light-emitting layer 8 to the anode 4.

In this embodiment, the pn-joining between the n+-type semiconductor layer 24 and the p+-type semiconductor layer 26 reduces the electron affinity of the n+-type semiconductor layer 24 and increases the ionization potential of the p+-type semiconductor layer 26, as illustrated in FIG. 3. As a result, the level difference between the electron affinity of the n+-type semiconductor layer 24 and the ionization potential of the p+-type semiconductor layer 26 reduces in post-stacking when compared to that in pre-stacking. During drive voltage application, the electron affinity of the n+-type semiconductor layer 24 reduces further, as illustrated in FIG. 5(a). As a result, the level difference between the electron affinity of the n+-type semiconductor layer 24 and the ionization potential of the p+-type semiconductor layer 26 reverses, and the conduction band level of the n+-type semiconductor layer 24 and the valence band level of the p+-type semiconductor layer 26 mix with each other. The depletion layer 30 is thin to such a degree that a tunnel effect occurs. This mixture and tunnel effect tends to cause electron drawing, denoted by Arrow E5 in FIGS. 5(a) and (b). Arrow E5 in FIGS. 5(a) and (b) denotes drawing where electrons in a valence band level within the p+-type semiconductor layer 26 tunnel through the depletion layer 30 to be drawn to the conduction band level of the n+-type semiconductor layer 24. Holes are produced in the p+-type semiconductor layer 26 as a result of the drawing.

In this embodiment, the depletion layer 32, extending astride the p+-type semiconductor layer 26 and the p-type semiconductor layer 28, is not eliminated even during drive voltage application, as illustrated in FIGS. 5(a) and (b). As a result, hole injection from the p+-type semiconductor layer 26 into the p-type semiconductor layer 28, denoted by Arrow H3 in FIGS. 5(a) and (b), is alone difficult.

Meanwhile, the depletion layers 30 and 32 are thin to such a degree that a tunnel effect occurs, and as earlier described, the n+-type semiconductor layer 24 has such a thickness as to be able to achieve a quantum well. These can produce a resonance tunnel effect between the n+-type semiconductor layer 24 and the p-type semiconductor layer 28. Furthermore, the valence band level of the p-type semiconductor layer 28 as well as the valence band level of the p+-type semiconductor layer 26 mixes with the conduction band level of the n+-type semiconductor layer 24 during drive voltage application. Accordingly, the resonance tunnel effect facilitates occurrence of electron drawing, denoted by Arrow E6 in FIGS. 5(a) and (b), from the valence band level of the p-type semiconductor layer 28 into the conduction band level of the n+-type semiconductor layer 24. Holes are produced in the p-type semiconductor layer 28 as a result of the drawing.

Further, the ionization potential of the p-type semiconductor layer 28 and the ionization potential of the shells 20 are substantially the same. Hence, hole injection from the p-type semiconductor layer 28 into the shells 20, denoted by Arrow H4 in FIG. 5(a), is also easy.

In this embodiment, electrons are transported from the n+-type semiconductor layer 24 to the anode 4, as denoted by Arrow E7 in FIG. 5(a). This transport, which is electron transport from an n+-type semiconductor to metal, is easy.

As described above, the efficiency of the electron transport denoted by Arrow E7 in FIG. 5(a), the efficiency of the electron drawing denoted by Arrow E6 in FIGS. 5(a) and (b), and the efficiency of the hole injection denoted by Arrow H4 in FIG. 5(a) are all very high. Thus, the efficiency of electron transport from the p+-type semiconductor layer 26 of the hole transport layer 6 to the anode 4, and the efficiency of hole transport from the p+-type semiconductor layer 26 of the hole transport layer 6 to the light-emitting layer 8 are also very high. Further, the hole transport layer 6 has the function of blocking electron transport from the light-emitting layer 8 to the anode 4.

Thus, in the light-emitting element 2 according to this embodiment, the efficiency of hole injection into the light-emitting layer 8 improves, the carrier balance in the light-emitting layer 8 improves, and the course of light emission in the light-emitting layer 8 increases. Hence, the external quantum efficiency of the entire light-emitting element 2 improves. Furthermore, the light-emitting element 2 according to this embodiment, which is not subject to constraints resulting from the difference in ionization energy between the anode 4 and the light-emitting layer 8, has high potential of development.

In this embodiment, the materials contained in the n+-type semiconductor layer 24, p+-type semiconductor layer 26, and p-type semiconductor layer 28 of the hole transport layer 6 as their base materials are the same as the material of the shells 20 in any of the examples. However, the material of the n+-type semiconductor layer 24 is preferably a II-IV group semiconductor material having a group II element belonging to a lower period in the periodic table than the group II element contained in the material of the shells 20. In this configuration, the II-IV group semiconductor, constituting the n+-type semiconductor layer 24, contains an element having a larger ion radius than the material of the shells 20. Thus, in the n+-type semiconductor layer 24, the valence orbit has relatively weak bonding, and the top of the valence band has small energy, that is, a small ionization potential. As a result, the valence band level of the p+-type semiconductor layer 26 and the valence band level of the p-type semiconductor layer 28 further mix with the conduction band level of the n+-type semiconductor layer 24, thus further easily causing the electron drawing denoted by Arrows E5 and E6 in FIGS. 5(a) and (b).

Modifications

The light-emitting device 1 according to this embodiment can undergo various modifications and improvements.

The n+-type semiconductor layer 24 may contain a first metal oxide semiconductor instead of the first II-VI group semiconductor. The first metal oxide semiconductor can contain an oxide of any of the elements in Group IIA, Group VIB, and Group VIIIB. That is, the first metal oxide semiconductor can contain an oxide of any of the elements in Group 6, Groups 8 to 10, and Group 12. Examples of the first metal oxide semiconductor include MgO, $Cr_2O_3$, and NiO.

The first metal oxide semiconductor is short of oxygen atoms with respect to a stoichiometry state, thus controlling the conductivity type and carrier concentration of the n+-type semiconductor layer 24. The amount of oxygen shortage is preferably 1.00E+17 [$cm^{-3}$] to 1.00E+23 [$cm^{-3}$] with respect to a metal element and is more desirably 1.00E+18 [$cm^{-3}$] to 1.00E+19 [$cm^{-3}$] with respect to the metal element.

The p+-type semiconductor layer 26 may contain a second metal oxide semiconductor instead of the second II-VI group semiconductor. The second metal oxide semiconductor can contain an oxide of any of the elements in Group IIA, Group VIB, and Group VIIIB. That is, the second metal oxide semiconductor can contain an oxide of any of the elements in Group 6, Groups 8 to 10, and Group 12. Examples of the second metal oxide semiconductor include MgO, $Cr_2O_3$, and NiO. Further, the second metal oxide semiconductor may include an identical metal oxide semiconductor composed of the same element combination as the metal oxide semiconductor included in the first metal oxide semiconductor.

The second metal oxide semiconductor has an excess of oxygen atoms with respect to a stoichiometry state, thus controlling the conductivity type and carrier concentration of the p+-type semiconductor layer 26. The amount of oxygen excess is preferably 1.00E+17 [$cm^{-3}$] to 1.00E+23 [$cm^{-3}$] with respect to a metal element and is more desirably 1.00E+18 [$cm^{-3}$] to 1.00E+19 [$cm^{-3}$] with respect to the metal element.

Figure 6:
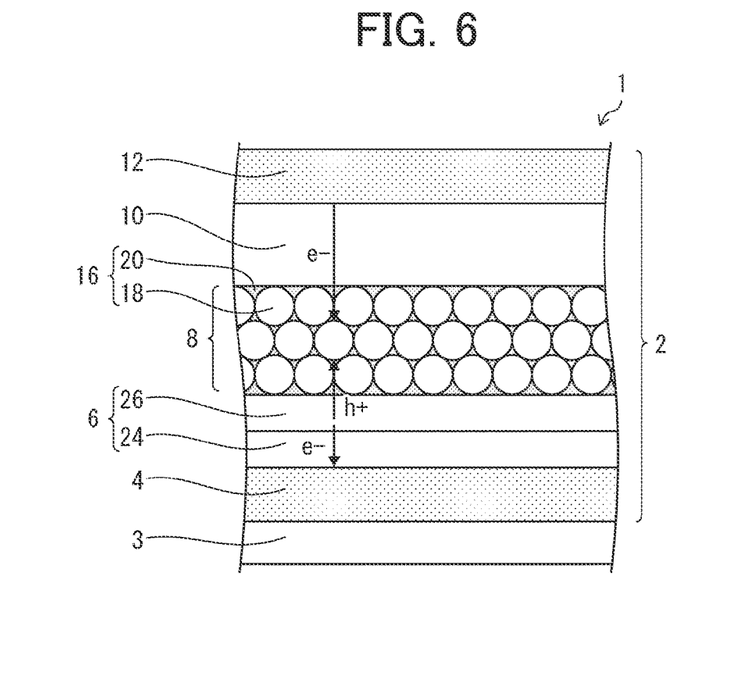
FIG. 6 is a schematic sectional view of one modification of the light-emitting device according to the first embodiment of the present disclosure.
Figure 7:
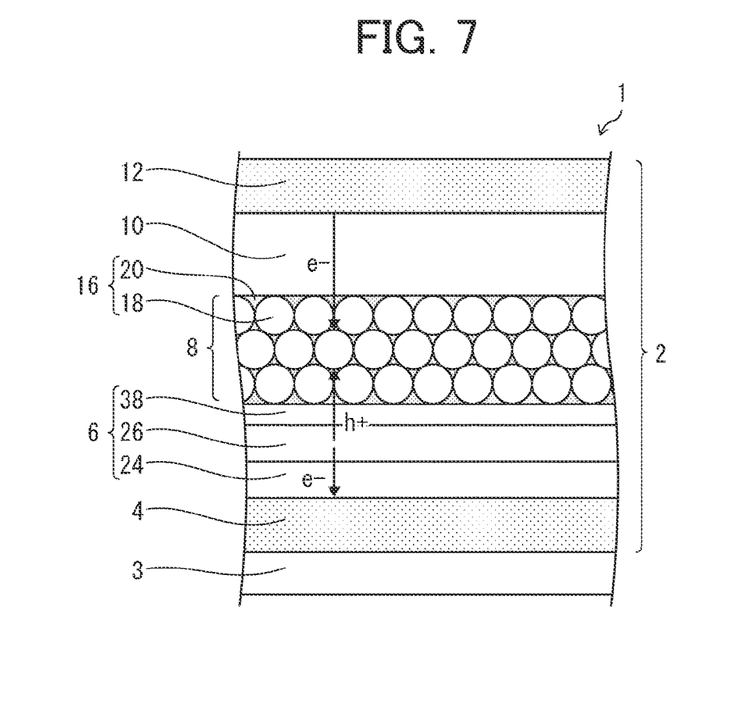
FIG. 7 is a schematic sectional view of another modification of the light-emitting device according to the first embodiment of the present disclosure.

FIG. 6 and FIG. 7 are each a schematic sectional view of one modification of the light-emitting device 1 according to this embodiment. The light-emitting element 2 according to this embodiment does not have to include the p-type semiconductor layer 28, as illustrated in FIG. 6. Alternatively, the light-emitting element 2 according to this embodiment may include an i-type semiconductor layer 38 containing the third II-VI group semiconductor, instead of the p-type semiconductor layer 28, as illustrated in FIG. 7. However, the light-emitting element 2 preferably includes the p-type semiconductor layer 28. One reason is that a configuration where the p-type semiconductor layer 28 is in contact with the shells 20 has a smaller ionization energy difference near the joint interface between the hole transport layer 6 and the shells 20 than a configuration where the p+-type semiconductor layer 26 is in contact with the shells 20. The other reason is that the p-type semiconductor layer 28 has a smaller electrical resistance than the i-type semiconductor layer 38, that is, the p-type semiconductor layer 28 has higher hole transport efficiency than the i-type semiconductor layer 38.

Second Embodiment

Figure 8:
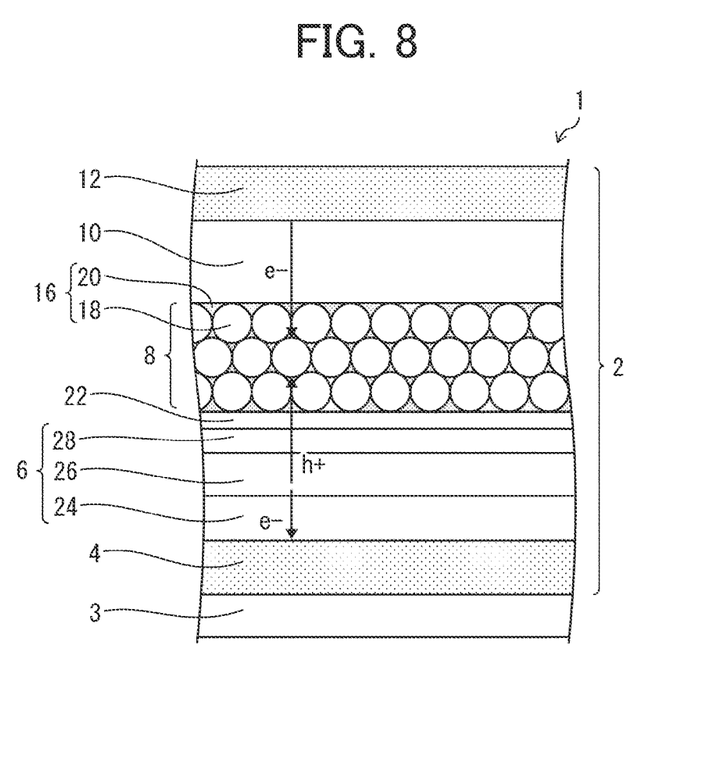
FIG. 8 is a schematic sectional view of a light-emitting device according to a second embodiment of the present disclosure.

FIG. 8 is a schematic sectional view of the light-emitting device 1 according to this embodiment. The light-emitting device 1 according to this embodiment has the same configuration as the light-emitting device 1 according to the foregoing embodiment with the exception that an non-conductor layer 22 is provided between the hole transport layer 6 and the light-emitting layer 8.

The non-conductor layer 22 has few carries and contains a non-conductor, which is an object with considerably poor electrical conductivity. Non-conductors are commonly also referred to as insulators or dielectrics. To be specific, the non-conductor layer 22 contains at least one in the group consisting of $Al_2O_3$, SiN, $SiO_2$, SiON, and $Cr_2O_3$. The non-conductor layer 22 is in contact with both the hole transport layer 6 and the light-emitting layer 8.

In the light-emitting element 2 according to this embodiment as well, holes and electrons are transported, generating excitons in the light-emitting layer 8, like the light-emitting element 2 according to the foregoing embodiment. However, hole injection from the hole transport layer 6 into the shells 20 is caused by holes tunneling through the non-conductor layer 22 as a result of a tunnel effect that occurs in the non-conductor layer 22.

Figure 9:
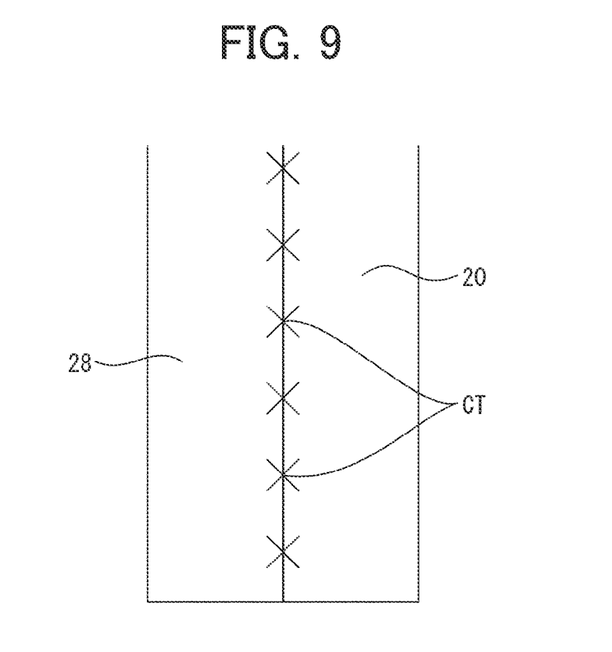
FIG. 9 is an enlarged energy band diagram of the light-emitting element according to the first embodiment of the present disclosure, with only the vicinity of the ionization potential near the joint interface between its hole transport layer and its light-emitting layer being extracted.
Figure 10:
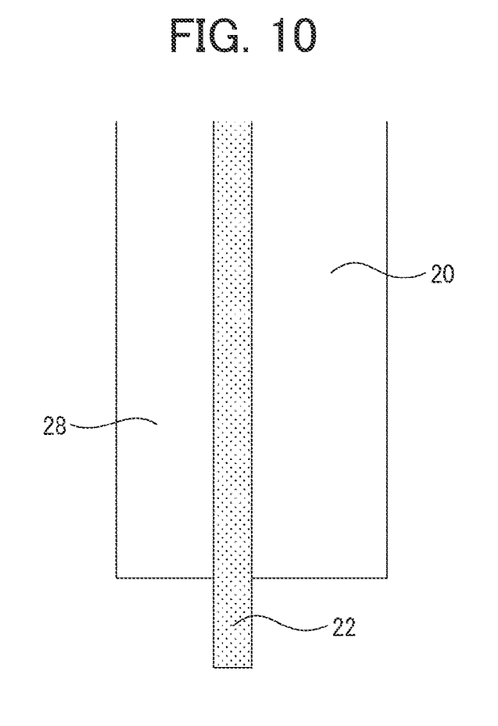
FIG. 10 is an enlarged energy band diagram of a light-emitting element according to the second embodiment of the present disclosure, with only the vicinity of the ionization potential near the joint interface between its hole transport layer and its light-emitting layer being extracted.

An effect of the light-emitting element 2 according to this embodiment will be described in comparison between an energy band diagram of the light-emitting element 2 according to the foregoing embodiment illustrated in FIG. 9 and an energy band diagram of the light-emitting element 2 according to this embodiment illustrated in FIG. 10. FIG. 9 and FIG. 10 are enlarged energy band diagrams of the respective light-emitting elements 2 according to foregoing embodiment and this embodiment, with only the vicinity of the ionization potential from the p-type semiconductor layer 28 of the hole transport layer 6 to the shell 20 being extracted.

The hole transport layer 6 and the light-emitting layer 8 are in direct contact with each other in the foregoing embodiment. Here, the contact between the hole transport layer 6 and the light-emitting layer 8 is inter-semiconductor contact. Further, a stacked structure is not produced through epitaxial growth in the light-emitting element 2 according to this embodiment, unlike a typical inorganic semiconductor light-emitting element. It is thus difficult in this embodiment to avoid level occurrence on the surfaces of the individual layers of the light-emitting element 2 and at their interfaces. Hence, an interface level is formed at the interface between the hole transport layer 6 and the shells 20.

Accordingly, carrier traps CT are formed at the interface between the hole transport layer 6 and the shells 20, as illustrated in FIG. 9. Once holes transported from the anode 4 are trapped in the carrier traps CT, the concentration of holes that are to be transported to the light-emitting layer 8 reduces, deteriorating the carrier balance in the light-emitting layer 8 in some cases.

In the embodiment by contrast, the non-conductor layer 22 is formed between the hole transport layer 6 and the light-emitting layer 8, as illustrated in FIG. 10. The contact between the hole transport layer 6 and the non-conductor layer 22 and the contact between the non-conductor layer 22 and the light-emitting layer 8 are both contact between a semiconductor and a non-conductor.

Hence, this embodiment can deactivate the interface level at the interface between the hole transport layer 6 and the non-conductor layer 22 and at the interface between the non-conductor layer 22 and the light-emitting layer 8 and, by extension, can reduce the carrier traps CT. Accordingly, holes transported from the anode 4 are less likely to be trapped in the carrier traps CT, thus further improving the carrier balance in the light-emitting layer 8.

The non-conductor layer 22 preferably has a thickness of 1 nm or greater in this embodiment in order to form the non-conductor layer 22 with more certainty to reduce carrier traps in the non-conductor layer 22. Further, the non-conductor layer 22 preferably has a thickness of 5 nm or smaller in this embodiment so that a tunnel effect of holes in the non-conductor layer 22 can be achieved sufficiently.

Modifications

Figure 11:
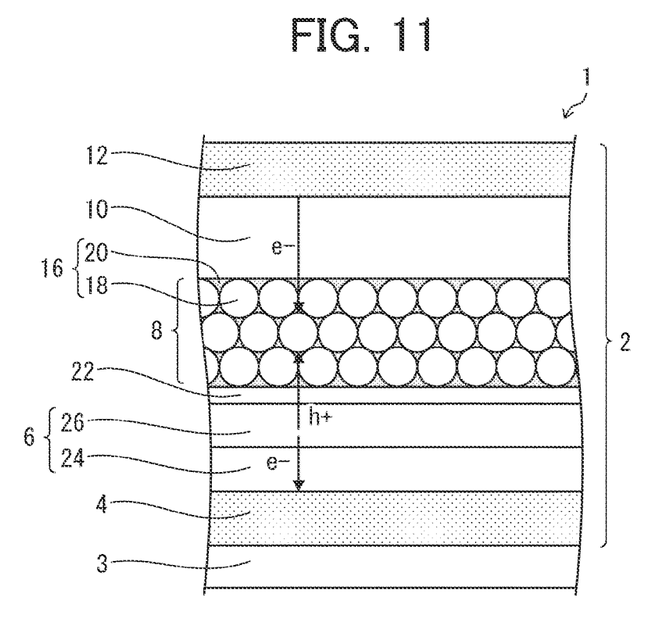
FIG. 11 is a schematic sectional view of one modification of the light-emitting device according to the second embodiment of the present disclosure.
Figure 12:
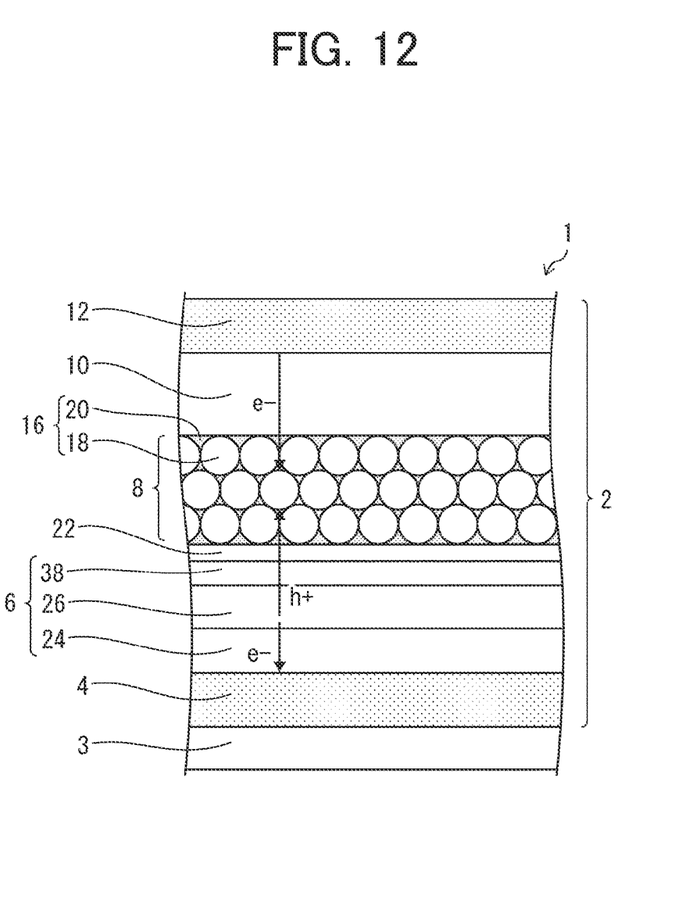
FIG. 12 is a schematic sectional view of another modification of the light-emitting device according to the second embodiment of the present disclosure.

FIG. 11 and FIG. 12 are each a schematic sectional view of one modification of the light-emitting device 1 according to this embodiment.

The light-emitting device 1 according to this embodiment can undergo various modifications and improvements, like the light-emitting device 1 according to the first embodiment. For instance, the light-emitting element 2 according to this embodiment does not have to include the p-type semiconductor layer 28 while including the non-conductor layer 22, as illustrated in FIG. 11. Alternatively, the light-emitting element 2 according to this embodiment may include the i-type semiconductor layer 38, containing the third II-VI group semiconductor, instead of the p-type semiconductor layer 28 while including the non-conductor layer 22, as illustrated in FIG. 12.

Summary

A light-emitting element according to a first aspect of the present disclosure includes the following: an anode; a cathode; a light-emitting layer disposed between the anode and the cathode and containing a quantum dot; and a hole transport layer disposed between the light-emitting layer and the anode, wherein the hole transport layer includes an n+-type semiconductor layer, and a p+-type semiconductor layer adjacent to the n+-type semiconductor layer and disposed closer to the light-emitting layer than the n+-type semiconductor layer.

A light-emitting element according to a second aspect of the present disclosure is the light-emitting element according to the first aspect, which may be configured such that the n+-type semiconductor layer contains a first II-VI group semiconductor, and a first dopant selected from a group 13 element and a group 17 element.

A light-emitting element according to a third aspect of the present disclosure is the light-emitting element according to the second aspect, which may be configured such that the first II-VI group semiconductor contains at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS and CdTeSe.

A light-emitting element according to a fourth aspect of the present disclosure is the light-emitting element according to the second or third aspect, which may be configured such that the first dopant contains at least one or more selected from Al, In, Ga, Cl, Br, and I.

A light-emitting element according to a fifth aspect of the present disclosure is the light-emitting element according to any one of the first to fourth aspects, which may be configured such that the n+-type semiconductor layer contains a first II-VI group semiconductor, and such that the first II-VI group semiconductor has an excess of group II elements with respect to a stoichiometry state.

A light-emitting element according to a sixth aspect of the present disclosure is the light-emitting element according to the fifth aspect, which may be configured such that the first II-VI group semiconductor contains Cd and a group VI element, and such that the content ratio of Cd is large with respect to the group VI element.

A light-emitting element according to a seventh aspect of the present disclosure is the light-emitting element according to the sixth aspect, which may be configured such that the first II-VI group semiconductor contains at least one or more selected from the group consisting of CdS, CdSe, CdTe, ZnCdSe, ZnCdS, ZnCdTe, CdSeS, CdTeS, and CdTeSe.

A light-emitting element according to an eighth aspect of the present disclosure is the light-emitting element according to the first aspect, which may be configured such that the n+-type semiconductor layer and the p+-type semiconductor layer contain identical metal oxide semiconductors composed of identical element combinations, such that the metal oxide semiconductor contained in the n+-type semiconductor layer is short of oxygen atoms with respect to a stoichiometry state, and such that the metal oxide semiconductor contained in the p+-type semiconductor layer has an excess of oxygen atoms with respect to a stoichiometry state.

A light-emitting element according to a ninth aspect of the present disclosure is the light-emitting element according to any one of the first to eighth aspects, which may be configured such that the p+-type semiconductor layer contains a second II-VI group semiconductor, and a second dopant selected from a group 1 element, a group 11 element, and a group 15 element.

A light-emitting element according to a tenth aspect of the present disclosure is the light-emitting element according to any one of the second to seventh aspects, which may be configured such that the p+-type semiconductor layer contains a second II-VI group semiconductor, and a second dopant selected from a group 1 element, a group 11 element, and a group 15 element, and such that the first II-VI group semiconductor and the second II-VI group semiconductor are semiconductors composed of element combinations identical to each other.

A light-emitting element according to an eleventh aspect of the present disclosure is the light-emitting element according to the ninth or tenth aspect, which may be configured such that
the second II-VI group semiconductor contains at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS, and CdTeSe.

A light-emitting element according to a twelfth aspect of the present disclosure is the light-emitting element according to any of the ninth to eleventh aspects, which may be configured such that the second dopant contains one or more selected from N, P, Cu, Ag, Li, and Na.

A light-emitting element according to a thirteenth aspect of the present disclosure is the light-emitting element according to any one of the ninth to twelfth aspects, which may be configured such that the hole transport layer includes an i-type semiconductor layer adjacent to the p+-type semiconductor layer and disposed closer to the light-emitting layer than the p+-type semiconductor layer, and such that the i-type semiconductor layer contains a third II-VI group semiconductor composed of the same element combination as the second II-VI group semiconductor.

A light-emitting element according to a fourteenth aspect of the present disclosure is the light-emitting element according to any one of the ninth to twelfth aspects, which may be configured such that the hole transport layer includes a p-type semiconductor layer adjacent to the p+-type semiconductor layer and disposed closer to the light-emitting layer than the p+-type semiconductor layer, such that the p-type semiconductor layer contains a third II-VI group semiconductor composed of the same element combination as the second II-VI group semiconductor, and a third dopant selected from a group 1 element, a group 11 element, and a group 15 element, and such that the concentration of the third dopant in the p-type semiconductor layer with respect to the third II-VI group semiconductor is lower than the concentration of the second dopant in the p+-type semiconductor layer with respect to the second II-VI group semiconductor.

A light-emitting element according to a fifteenth aspect of the present disclosure is the light-emitting element according to the thirteenth aspect, which may be configured such that the i-type semiconductor layer is thinner than the p+-type semiconductor layer.

A light-emitting element according to a sixteenth aspect of the present disclosure is the light-emitting element according to the fourteenth aspect, which may be configured such that the p-type semiconductor layer is thinner than the p+-type semiconductor layer.

A light-emitting element according to a seventeenth aspect of the present disclosure is the light-emitting element according to any one of the ninth to sixteenth aspects, which may be configured such that the quantum dot includes a core and a shell covering the core, and such that the shell contains a fourth II-VI group semiconductor composed of the same element combination as the second II-VI group semiconductor.

A light-emitting element according to an eighteenth aspect of the present disclosure is the light-emitting element according to any one of the second to fourth aspects, which may be configured such that the addition amount of the first dopant in the n+-type semiconductor layer is 1.00E+17 $[cm^{-3}]$ to 1.00E+23 $[cm^{-3}]$.

A light-emitting element according to a nineteenth aspect of the present disclosure is the light-emitting element according to any one of the ninth to seventeenth aspects, which may be configured such that the addition amount of the second dopant in the p+-type semiconductor layer is 1.00E+17 $[cm^{-3}]$ to 1.00E+23 $[cm^{-3}]$.

A light-emitting element according to a twentieth aspect of the present disclosure is the light-emitting element according to any one of the second to seventh aspects, which may be configured such that the quantum dot includes a core and a shell covering the core, such that the shell contains a fourth II-VI group semiconductor selected from II-VI group semiconductors, and such that the group II element contained in the first II-VI group semiconductor is included in a lower period than the group II element contained in the fourth II-VI group semiconductor.

A light-emitting element according to a twenty-first aspect of the present disclosure is the light-emitting element according to the fourteenth or sixteenth aspect, which may be configured such that the third dopant contains the same element as the second dopant.

A light-emitting device according to a twenty-second aspect of the present disclosure includes the light-emitting element according to any one of the first to twenty-first aspects.

The present disclosure is not limited to the foregoing embodiments. Various modifications can be devised within the scope of the claims. An embodiment that is obtained in combination, as appropriate, with the technical means disclosed in the respective embodiments is also included in the technical scope of the present disclosure. Furthermore, combining the technical means disclosed in the respective embodiments can form a new technical feature.

REFERENCE SIGNS LIST 1 light-emitting device
2, 102 light-emitting element
4 anode
6, 106 hole transport layer
8 light-emitting layer
10 electron transport layer
12 cathode
16 quantum dot
18 core
20 shell
22 non-conductor layer
24 n+-type semiconductor layer
26 p+-type semiconductor layer
28 p-type semiconductor layer
38 i-type semiconductor layer

The invention claimed is:
1. A light-emitting element comprising:
an anode;
a cathode;
a light-emitting layer disposed between the anode and the cathode and containing a quantum dot; and
a hole transport layer disposed between the light-emitting layer and the anode,
wherein the hole transport layer includes
an n+-type semiconductor layer, and a p+-type semiconductor layer adjacent to the n+-type semiconductor layer and disposed closer to the light-emitting layer than the n+-type semiconductor layer.

2. The light-emitting element according to claim 1, wherein the n+-type semiconductor layer contains a first II-VI group semiconductor, and a first dopant selected from a group 13 element and a group 17 element.

3. The light-emitting element according to claim 2, wherein the first II-VI group semiconductor contains at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS and CdTeSe.

4. The light-emitting element according to claim 2, wherein the first dopant contains at least one or more selected from Al, In, Ga, Cl, Br, and I.

5. The light-emitting element according to claim 1, wherein
the n+-type semiconductor layer contains a first II-VI group semiconductor, and
the first II-VI group semiconductor has an excess of group II elements with respect to a stoichiometry state.

6. The light-emitting element according to claim 5, wherein
the first II-VI group semiconductor contains
Cd and a group VI element, and
a content ratio of Cd is large with respect to the group VI element.

7. The light-emitting element according to claim 6, wherein the first II-VI group semiconductor contains at least one or more selected from the group consisting of CdS, CdSe, CdTe, ZnCdSe, ZnCdS, ZnCdTe, CdSeS, CdTeS, and CdTeSe.

8. The light-emitting element according to claim 1, wherein
the n+-type semiconductor layer and the p+-type semiconductor layer contain identical metal oxide semiconductors composed of identical element combinations,
the metal oxide semiconductor contained in the n+-type semiconductor layer is short of oxygen atoms with respect to a stoichiometry state, and
the metal oxide semiconductor contained in the p+-type semiconductor layer has an excess of oxygen atoms with respect to a stoichiometry state.

9. The light-emitting element according to claim 1, wherein the p+-type semiconductor layer contains a second II-VI group semiconductor, and a second dopant selected from a group 1 element, a group 11 element, and a group 15 element.

10. The light-emitting element according to claim 2, wherein
the p+-type semiconductor layer contains
a second II-VI group semiconductor, and
a second dopant selected from a group 1 element, a group 11 element, and a group 15 element, and
the first II-VI group semiconductor and the second II-VI group semiconductor are semiconductors composed of element combinations identical to each other.

11. The light-emitting element according to claim 9, wherein the second II-VI group semiconductor contains at least one or more selected from the group consisting of ZnS, ZnSe, CdS, CdSe, CdTe, ZnTe, ZnCdSe, ZnCdS, ZnCdTe, ZnSeS, CdSeS, ZnTeS, ZnTeSe, CdTeS, and CdTeSe.

12. The light-emitting element according to claim 9, wherein the second dopant contains one or more selected from N, P, Cu, Ag, Li, and Na.

13. The light-emitting element according to claim 9, wherein
the hole transport layer includes an i-type semiconductor layer adjacent to the p+-type semiconductor layer and disposed closer to the light-emitting layer than the p+-type semiconductor layer, and
the i-type semiconductor layer contains a third II-VI group semiconductor composed of a same element combination as the second II-VI group semiconductor.

14. The light-emitting element according to claim 9, wherein
the hole transport layer includes a p-type semiconductor layer adjacent to the p+-type semiconductor layer and disposed closer to the light-emitting layer than the p+-type semiconductor layer,
the p-type semiconductor layer contains a third II-VI group semiconductor composed of a same element combination as the second II-VI group semiconductor, and a third dopant selected from a group 1 element, a group 11 element, and a group 15 element, and
a concentration of the third dopant in the p-type semiconductor layer with respect to the third II-VI group semiconductor is lower than a concentration of the second dopant in the p+-type semiconductor layer with respect to the second II-VI group semiconductor.

15. The light-emitting element according to claim 13, wherein the i-type semiconductor layer is thinner than the p+-type semiconductor layer.

16. The light-emitting element according to claim 14, wherein the p-type semiconductor layer is thinner than the p+-type semiconductor layer.

17. The light-emitting element according to claim 9, wherein
the quantum dot includes a core and a shell covering the core, and
the shell contains a fourth II-VI group semiconductor composed of a same element combination as the second II-VI group semiconductor.

18. The light-emitting element according to claim 2, wherein an addition amount of the first dopant in the n+-type semiconductor layer is 1.00E+17 [cm$^{-3}$] to 1.00E+23 [cm$^{-3}$].

19. The light-emitting element according to claim 9, wherein an addition amount of the second dopant in the p+-type semiconductor layer is 1.00E+17 [cm$^{-3}$] to 1.00E+23 [cm$^{-3}$].

20. A light-emitting device comprising the light-emitting element according to claim 1.

* * * * *